(12) United States Patent
Yeh et al.

(10) Patent No.: US 6,372,663 B1
(45) Date of Patent: Apr. 16, 2002

(54) DUAL-STAGE WET OXIDATION PROCESS UTILIZING VARYING $H_2/O_2$ RATIOS

(75) Inventors: Su-Yu Yeh; Chien-Jiun Wang, both of Taipei; Jih-Hwa Wang, Hsin Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/482,989

(22) Filed: Jan. 13, 2000

(51) Int. Cl.[7] .................... H01C 21/31; H01C 21/469; C23C 16/40; C23C 14/10
(52) U.S. Cl. .............. 438/773; 427/255.27; 427/255.37
(58) Field of Search ................ 438/773; 427/255.27, 427/255.37, 372.2

(56) References Cited

U.S. PATENT DOCUMENTS

| | | | | |
|---|---|---|---|---|
| 4,154,192 A | * | 5/1979 | Tsubouchi et al. | 118/49.1 |
| 4,849,025 A | * | 7/1989 | Bain et al. | 134/22.1 |
| 5,257,926 A | * | 11/1993 | Drimer et al. | 431/154 |
| 5,526,984 A | * | 6/1996 | Foster et al. | 239/423 |
| 5,633,212 A | * | 5/1997 | Yuuki | 438/773 |
| 5,810,929 A | * | 9/1998 | Yuuki | 118/697 |
| 5,928,521 A | * | 7/1999 | Levec | 210/758 |
| 6,007,883 A | * | 12/1999 | Foster et al. | 428/34.1 |
| 6,179,609 B1 | * | 1/2001 | Drimer et al. | 431/11 |
| 6,221,791 B1 | * | 4/2001 | Wang et al. | 438/773 |

FOREIGN PATENT DOCUMENTS

JP          6112329     *   5/1986

* cited by examiner

Primary Examiner—Olik Chaudhuri
Assistant Examiner—Shrinivas H. Rao
(74) Attorney, Agent, or Firm—Tung & Associates

(57) ABSTRACT

A method for forming silicon oxide layers on silicon wafers by a wet oxidation process that utilizes a dual-stage pyrolysis is described. The process can be carried out by flowing a first $H_2/O_2$ mixture that has a first $H_2/O_2$ gas mixture ratio into a torch and then feeding water vapor generated into the wet oxidation chamber to form a first layer of silicon oxide, and then flowing a second $H_2/O_2$ mixture that has a second $H_2/O_2$ gas mixture ratio into the torch and feeding water vapor generated into the wet oxidation chamber for forming a second thickness of the silicon oxide layer. The second $H_2/O_2$ ratio is smaller than the first $H_2/O_2$ ratio by at least ⅓ of the value of the first $H_2/O_2$ ratio. For instance, when the first $H_2/O_2$ ratio used is large than 1.5, the second $H_2/O_2$ ratio used is less than 1.2. In one example, the first $H_2/O_2$ gas mixture ratio utilized is 1.8, while the second $H_2/O_2$ gas mixture ratio utilized is 1.0. It has been found that by reducing the hydrogen content, i.e. by decreasing the $H_2/O_2$ gas mixture ratio, the partial pressure of the water vapor generated is reduced which minimizes the loading effect in the furnace tube during the wet oxidation process and improves the uniformity of the silicon oxide layers deposited.

19 Claims, 2 Drawing Sheets

DUAL-STAGE WET OXIDATION PROCESS UTILIZING VARYING $H_2/O_2$ RATIOS

FIELD OF THE INVENTION

The present invention generally relates to a wet oxidation process for forming silicon oxide layers and more particularly, relates to a dual-stage wet oxidation process for forming silicon oxide layers wherein different $H_2/O_2$ are utilized in two separate stages.

BACKGROUND OF THE INVENTION

The formation of silicon oxide on a silicon substrate is a frequently conducted process in the fabrication of semiconductor devices. One of the methods for forming silicon oxide is thermal oxidization which is carried out by subjecting a silicon wafer to an oxidizing ambient at elevated temperatures. A common objective of an oxidizing system is to obtain a high quality silicon oxide film of uniform thickness while maintaining a low thermal budget (the product of temperature and time). Methods have been developed to increase the oxidation rate and to reduce the oxidation time and temperature. Two of such methods are the dry oxidation method and the wet oxidation method by using an external torch.

The substances used to grow thermal oxides on a silicon surface are dry oxygen and water vapor. In a dry oxygen reaction, silicon oxide is formed by $Si+O_2 \rightarrow SiO_2$, while for water vapor, the reaction is $Si+2H_2O \rightarrow SiO_2+2H_2$. In both cases, silicon is consumed and converted into silicon dioxide.

In a dry oxidation process, silicon dioxide layers can be formed in a temperature range of 400° C.~1150° C. The process is typically performed in a resistance-heated furnace or in a rapid thermal processing chamber with heat provided by tungsten halogen lamps. In a typical dry oxidation process, a horizontal furnace tube may be used in which a batch of wafers is introduced into the furnace tube positioned in a slow moving wafer boat and then heated to an oxidation temperature in a ramp-up process. The wafers are held at the elevated temperature for a specific length of time and then brought back to a low temperature in a ramp-down process. In the dry oxidation process, oxygen mixed with an inert carrier gas such as nitrogen is passed over the wafers that are held at an elevated temperature.

A wet oxidation process can be performed by either bubbling oxygen through a high purity water bath maintained at between 85° C. and 95° C., or by a direct reaction of hydrogen with oxygen producing water vapor in a pyrogenic steam oxidation process.

The thermal budget required to grow a silicon oxide layer to a certain thickness is considerably smaller in a wet oxidation process than that in a dry oxidation process. The wet oxidation process for producing a silicon oxide film can therefore be carried out more efficiently and at a lower cost. However, because of a residual water content, silicon oxide films formed by the wet oxidation process exhibit a lower dielectric strength and has higher porosity to impurity penetration than silicon oxide films formed in a dry oxidation process. As a compromise, wet oxidation process is frequently used in conjunction with dry oxidation process such that a high quality oxide film can be grown with minimized oxidation time required. This is performed by beginning and ending an oxidation process in dry oxygen while using the wet oxidation process for the intermediate stage which reduces the thermal budget while increasing the overall oxide growth rate. By using this dry oxidation-wet oxidation-dry oxidation process sequence, high quality silicon oxide films can be grown on both sides of the oxide layer in order to provide properties of the three-layered film comparable to those of a single layer grown by a dry oxidation process alone.

Another benefit of the wet oxidation process is that the apparatus used for carrying out the wet oxidation may also be used to carry out a dry oxidation process. For instance, as shown in FIG. 1, a wet oxidation apparatus 10 consists of an oxidation chamber 12, an external torch 14, and a conduit 16 that connects the external torch 14 and the oxidation chamber 12 for providing fluid communication therein between. The wet oxidation apparatus 10 further includes conduit 20 for feeding an inert gas into conduit 16 for purging both the conduit 16 and the oxidation chamber 12, conduit 22 for flowing oxygen into the external torch 14 by a carrier inert gas, and conduit 24 for flowing hydrogen into the external torch 14 with an inert carrier gas. An exhaust conduit 28 takes away unused or excess water vapor in the oxidation chamber 12. The flow of gases in conduits 20, 22 and 24 is controlled by valves 30, 32 and 34, respectively.

The convention wet oxidation apparatus 10 shown in FIG. 1 has been used for many years. In a normal silicon oxide growth process, in order to achieve high growth rates while minimizing the thermal budget of the process, the maximum $H_2/O_2$ gas mixture ratio of 1.8 is used for producing thick silicon oxide layers, i.e. layers thicker than 2000 Å. At the high $H_2/O_2$ gas mixture ratio of 1.8, the partial pressure of water vapor in the reaction chamber is very high which causes a loading effect, i.e., the lesser number of wafers are loaded in the reaction chamber, the poorer is the wafer-to-wafer coating uniformity.

In the conventional thick silicon oxide growth process carried out by the water oxide method, the process is carried out by a single step pyrolysis technique at a high $H_2/O_2$ ratio of about 1.8. The gas mixture ratio of 1.8 for $H_2/O_2$ is the highest possible within a safety limit without the danger of causing an explosion in the furnace. After the gas mixture is burned in a torch, the high $H_2/O_2$ gas mixture ratio produces high water pressure in the furnace tube and thus achieves a high growth rate of silicon oxide. However, the excess water vapor left in the furnace tube does not stop reacting on the plurality of wafers positioned in the furnace until the water vapor is purged out by an inert gas.

The reaction mechanism in the wet oxidation process can be shown as follows:

$2H_2O+Si \rightarrow +SiO_2+2H_2$. (The original reaction)

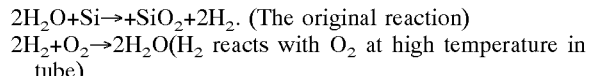
$2H_2+O_2 \rightarrow 2H_2O(H_2$ reacts with $O_2$ at high temperature in tube)

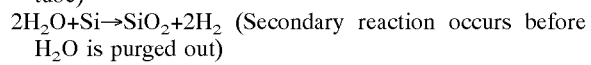
$2H_2O+Si \rightarrow SiO_2+2H_2$ (Secondary reaction occurs before $H_2O$ is purged out)

The secondary reaction causes an effect known as the loading effect in which when the furnace tube is loaded only with a few wafer and that the wafers are charged from the top of the boat, the loading effect is very serious in the top than the bottom due to the different gas flow conditions leading to poor wafer-to-wafer uniformity.

The loading effect occurring in a conventional wet oxidation process for growing silicon oxide is shown in FIG. 2. As described above, the excess wet vapor in the furnace tube does not stop reacting even after the main pyrolysis step is completed, until all the water vapor is purged out by an inert gas such as nitrogen. The loading effect becomes more serious in the upper chamber of the furnace than the lower chamber when more wafers are positioned in the upper chamber. As shown in FIG. 2, at the lower end of the total number of wafers processed, a deviation in the thicknesses of the silicon oxide layers formed on wafers positioned in the upper chamber can be as high as 100 Å. This deviation is greatly reduced, as shown by the data in FIG. 2 to about 20 Å, when 144 wafers are loaded in the furnace tube. In a semiconductor fabrication facility, the furnace tube cannot always be loaded full of wafers, it is therefore inevitable that whenever there are only a few wafers loaded in the furnace tube, the uniformity in thickness of the silicon oxide layers formed on the wafers becomes unacceptable.

For instance, data plotted in FIG. 2 are obtained by a conventional wet oxidation recipe in which three burn steps are first carried out; the first burn step for about 2 minutes at an $O_2$ flow rate of 10 liter/min, a second burn step of about 1 minute at a $O_2$ flow rate of 3.5 liter/min, followed by a third burn step for about 1 minute with a $H_2$ flow rate of 3.0 liter/min and an $O_2$ flow rate of 3.5 liter/min. After the three burn steps, the pyrolysis reaction is carried out for a time period of 90~120 minutes at a $H_2$ flow rate of 8 liter/min and an $O_2$ flow rate of 4 liter/min which represents a $H_2/O_2$ gas mixture ratio of 1.6. After the pyrolysis process for growing silicon oxide, an inert gas purge such as nitrogen gas purge is conducted to shut-off the oxygen and hydrogen gas flows.

Data obtained from the conventional wet oxidation recipe shown above indicates a wafer-to-wafer uniformity of large than 1.2% and an upper chamber/lower chamber deviation of about 60 Å. These numbers are not acceptable in an IC fabrication process that has tight tolerances on the device manufactured.

It is therefore an object of the present invention to provide a wet oxidation method for growing silicon oxide that does not have the drawbacks or shortcomings of the conventional methods.

It is another object of the present invention to provide a method of wet oxidation for growing silicon oxide that incorporates simple modifications for achieving an improved process and uniformity.

It is a further object of the present invention to provide a wet oxidation method for growing silicon oxide that does not utilize a single-stage pyrolysis process.

It is another further object of the present invention to provide a method of wet oxidation for growing silicon oxide in a vertical furnace that is carried out by a dual-stage pyrolysis process.

It is still another object of the present invention to provide a wet oxidation process for growing silicon oxide that utilizes a dual-stage deposition process at different $H_2/O_2$ gas mixture ratios.

It is yet another object of the present invention to provide a wet oxidation process for growing silicon oxide in a vertical furnace that is capable of producing more uniform silicon oxide layers on wafers positioned in the upper and the lower chamber.

It is still another further object of the present invention to provide a wet oxidation process for growing silicon oxide layers by using a dual-stage pyrolysis process wherein the $H_2/O_2$ gas mixture ratio used in the second stage is at least ⅓ smaller than that used in the first stage.

It is yet another further object of the present invention to provide a wet oxidation process for growing silicon oxide in a vertical furnace in which a first stage pyrolysis process utilizes a $H_2/O_2$ gas mixture ratio larger than 1.5 while a second stage pyrolysis process utilizes a $H_2/O_2$ ratio smaller than 1.2

SUMMARY OF THE INVENTION

In accordance with the present invention, a method for forming silicon oxide by wet oxidation that utilizes a dual-stage pyrolysis technique is disclosed.

In a preferred embodiment, a method for forming silicon oxide by wet oxidation can be carried out by the operating steps of first providing an oxidation chamber equipped with a torch and a conduit providing fluid communication between the chamber and the torch, positioning a plurality of silicon wafers in the oxidation chambers flowing a first $H_2/O_2$ mixture that has a first $H_2/O_2$ ratio into the torch and feeding water vapor generated through the conduit into the oxidation chamber for a first time period, flowing a second $H_2/O_2$ that has a second $H_2/O_2$ ratio into the torch and feeding water vapor generated through the second conduit into the oxidation chamber for a second time period. The second $H_2/O_2$ ratio is smaller than the first $H_2/O_2$ ratio by at least ⅓ of the value of the first $H_2/O_2$ ratio.

In the method for forming silicon oxide for wet oxidation, the second time period is smaller than the first time period. The second time period is between about 10% and about 40% of the first time period. The first time period is between about 50 min. and about 90 min., and the second time period is between about 10 min. and about 30 min. The first $H_2/O_2$ ratio may be larger than 1.2 and the second $H_2/O_2$ ratio may be smaller than 1.2. The first $H_2/O_2$ ratio may also be larger than 1.6 and the second $H_2/O_2$ ratio may also be smaller than 1.1. The method may further include a nitrogen purging and oxygen annealing process. The method may further include a nitrogen purging process for stopping the flow of $H_2/O_2$.

In another preferred embodiment, the present invention discloses a method for growing silicon oxide layers on silicon wafers by a wet oxidation process which includes the steps of providing a wet oxidation chamber equipped with a torch and conduit providing fluid communication between the chamber and the torch, positioning a plurality of silicone wafers in the wet oxidation chamber, flowing a first $H_2/O_2$ mixture that has a $H_2/O_2$ ratio large than 1.5 into the torch and fed water vapor generated through the conduit into the wet oxidation chamber for a first time period, and flowing $H_2/O_2$ mixture that has a $H_2/O_2$ ratio smaller than 1.2 into the torch and feed water vapor generated through the conduit into the wet oxidation chamber for a second time period.

The method for growing silicon oxide layers on silicon wafers by a wet oxidation process may further include the step of positioning each of the plurality of silicon wafers horizontally in a vertical stack. The method may further include the step of flowing $H_2$ and $O_2$ individually into the torch for mixing in the torch and reacting paralytically to produce water vapor. The first time period may be at least 2 times of the second time period, or the first time period may be at least 3 times of the second time period. The first time period may be more than 40 min. and the second time period may be less than 20 min. The second $H_2/O_2$ ratio may be smaller than the first $H_2/O_2$ ratio by at least ⅓ of the value of the first $H_2/O_2$ ratio. The method may further include the step of depositing silicon oxide layers on the plurality of silicon wafers to a thickness of at least 1000 Å, or to a thickness of a least 2000 Å.

In still another preferred embodiment, a dual-stage wet oxidation process for forming silicon oxides layers can be carried out by the operating steps of first providing an oxidation chamber equipped with a torch and a conduit and providing fluid communication between the chamber and the torch, positioning a plurality of silicon wafers horizontally in a vertical stack in the chamber, flowing a $H_2/O_2$ mixture that has a $H_2/O_2$ ratio large than 1.5 into the torch and feeding water vapor generated through the conduit into the oxidation chamber for more than 40 min. in a first stage for forming a first thickness of silicon oxide, and flowing a $H_2/O_2$ mixture that has a $H_2/O_2$ ratio smaller than 1.2 into the torch and feeding water vapor generated through the conduit into the oxidation chamber for less than 20 min. in a second stage for forming a second thickness of silicon oxide.

The dual-stage wet oxidation process for forming silicon oxide layers may further include the step of forming the first and the second thickness of silicon oxide on the plurality of silicon wafers to a total thickness of at least 2000 Å. The method may further include a nitrogen purging and an oxygen annealing step after the first and the second stage of forming silicon oxide.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming silicon oxide by a wet oxidation process in which a pyrolysis step is carried out in a dual-stage process utilizing different $H_2/O_2$ gas mixture ratios. To carry out the present invention process, a plurality of silicon wafers is first positioned horizontally in a vertical stack in a furnace tube that is equipped with an external torch for generating water vapor from a gas mixture of hydrogen and oxygen. A first $H_2/O_2$ mixture is then formed in the torch that has a first $H_2/O_2$ ratio and water vapor generated is fed through a conduit into the oxidation chamber to grow silicon oxide on the silicon wafers. A second $H_2/O_2$ mixture that has a different $H_2/O_2$ gas mixture ratio is then flown into the torch and water vapor generated is fed into the oxidation chamber for growing a second layer of silicon oxide on the wafers. The second $H_2/O_2$ gas mixture ratio is smaller than the first $H_2/O_2$ gas mixture ratio by at least ⅓ of the value of the first gas mixture ratio. The second reaction time is significantly shorter than the first reaction time, i.e. the second reaction time is between about 10% and about 40% of the first reaction time. When the first hydrogen rich gas mixture may have a ratio larger than 1.5, the second gas mixture that is hydrogen poor may have a gas mixture ratio of smaller than 1.2. A typical gas mixture ratio used for the first $H_2/O_2$ mixture may be 1.8, while a typical gas mixture ratio used for the second $H_2/O_2$ mixture may be 1.0.

The present invention novel dual-stage oxidation method therefore utilizes a new recipe for dividing the pyrolysis process into two steps, with the second step in a lower $H_2/O_2$ gas mixture ratio such that a lower water pressure is produced in the furnace tube in order to minimize the loading effect, or to improve the uniformity of silicon oxide layers. The present invention novel method does not significantly increase the total process time required, i.e. the time increase may be only 2~3 minutes which is insignificant considering the total process may require between about 70 min and about 120 min. The thermal budget required for the present invention novel method is further beneficially controlled.

By utilizing the present invention novel method, the loading effect can be significantly reduced to improve the wafer-to-wafer uniformity in the silicon oxide layers formed. The total process time required is increased minimally such that the throughput and the thermal budget for the process is well controlled. Moreover, the present invention novel method does not have any impact on the properties of the device fabricated.

Figure 1:
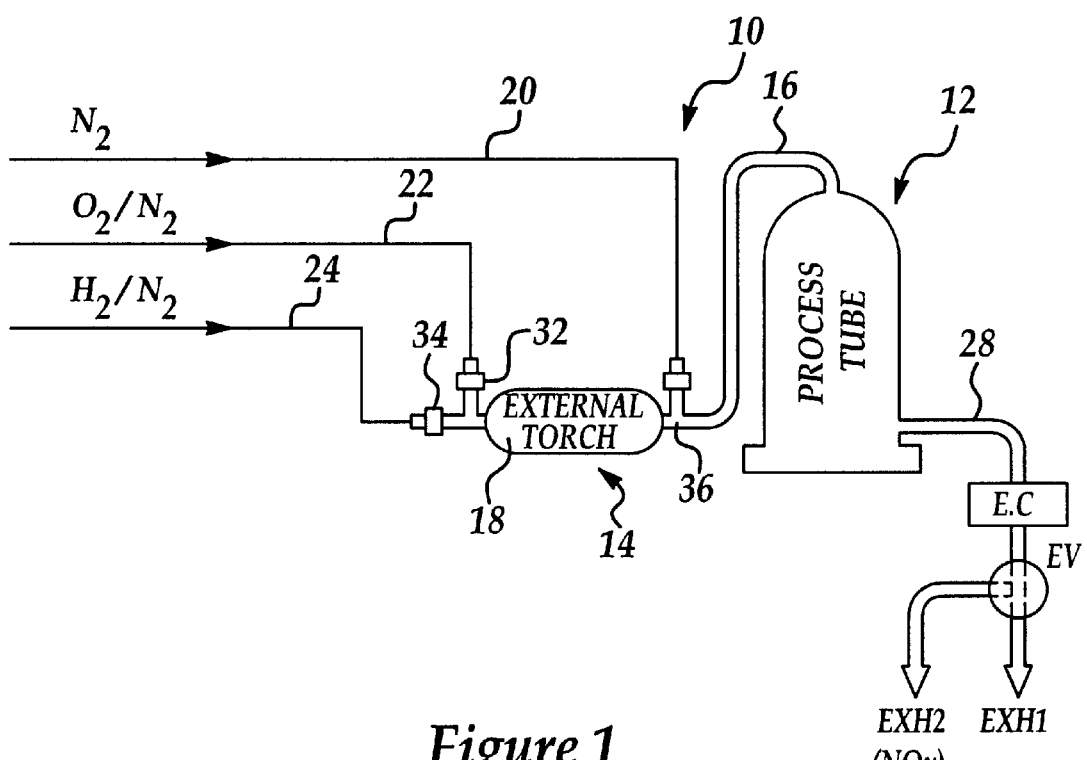
FIG. 1 is an illustration of a conventional wet oxidation apparatus for forming silicon oxide on silicon wafers.
Figure 2:
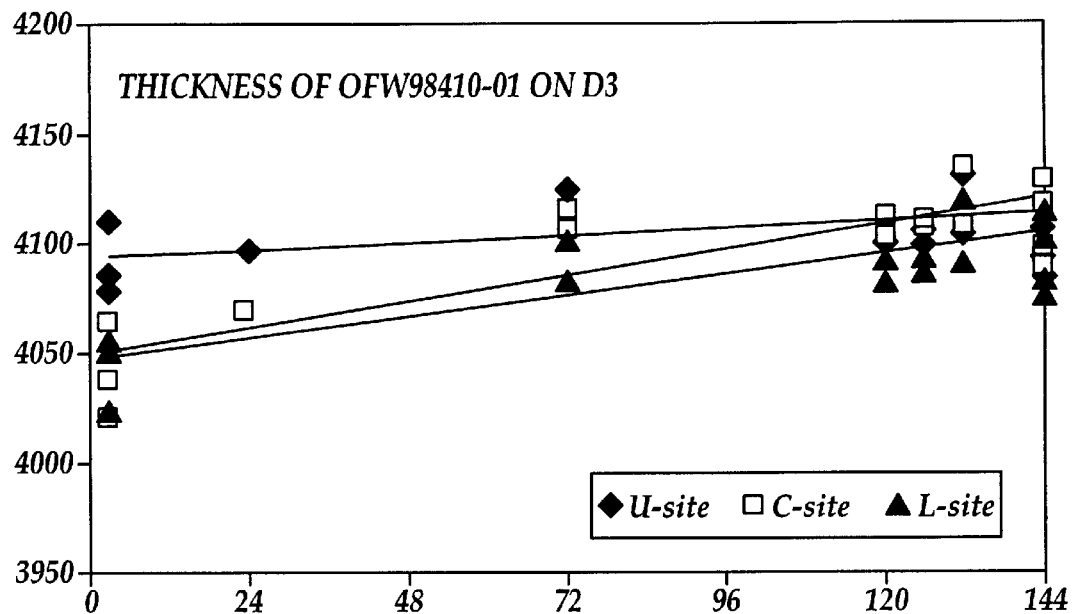
FIG. 2 is a graph illustrating the thickness variation of silicon oxide layers on silicon wafers formed by a conventional wet oxidation process.
Figure 3:
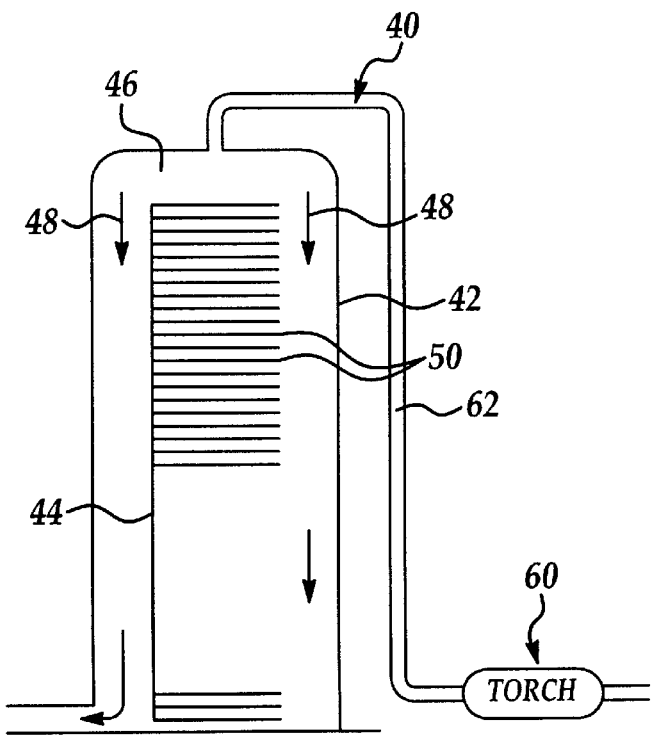
FIG. 3 is a cross-sectional view of the present invention wet oxidation chamber partially loaded with wafers.

It is the unique discovery of the present invention novel method that by decreasing the partial pressure of water vapor in the furnace tube, the loading effect due to a partial loading condition in the furnace tube can be significantly reduced. As shown in FIG. 3, a furnace tube 40 is provided which is constructed by a furnace body 42 and a wafer rack 44. An external torch 60 feeds wafer vapor 48 into chamber cavity 46 through conduit 62. Reactant gases of $O_2/N_2$ and $H_2/N_2$ are fed into torch 60 through conducts 64, 66, respectively. A plurality of silicon wafers 50 are positioned on the wafer rack 44 from the top of the rack downwardly. As shown in FIG. 3, when only half of the rack 44 is loaded, the bottom half of the rack 44 is substantially empty which changes the flow characteristic of water vapor entering into the chamber cavity 46. The water vapor flow pattern through the top portion of rack 44, that is full of wafers positioned therein and the flow pattern through the vacant rack, i.e. the bottom of rack 44 is significantly different to cause a loading effect when a conventional one-step pyrolysis process is utilized.

By utilizing the present invention novel dual-stage pyrolysis process, the loading effect is significantly reduces resulting in an improved uniformity of the silicon oxide thickness formed.

A typical present invention novel dual-stage pyrolysis process for wet oxidation can be carried out in the following manner. First, three burn steps that are similar to that used in the conventional wet oxidation process are carried out consisting of a first burn step for about 2 min at an $O_2$ flow of about 10~15 liter/min, a second burn step for about 1 minute at an $O_2$ flow rate of about 3~6 liter/min, and followed by a third burn step for about 1 minute at a $H_2$ flow of about 3~6 liter/min and an $O_2$, flow of about 3~6 liter/min. The dual-stage pyrolysis process is then carried out by a first stage for about 60~80 minutes at a $H_2$ flow rate of about 7 liter/min and an $O_2$ flow rate of about 4 liter/min, resulting in a $H_2/O_2$ gas mixture ratio of 1.8. A second stage pyrolysis process is then carried for a time period of about 10~30 min. at a $H_2$ flow rate of about 2 liter/min. and an $O_2$ flow rate of about 2 liter/min, or at a $H_2/O_2$ gas mixture ratio of 1. The present invention dual-stage pyrolysis process is then followed by an inert gas purging process for shutting off the reactant gases of $H_2$ and $O_2$, and by an $O_2$ annealing process. It should be noted that the first stage process can be carried out for a first time period of at least 50 min, while the second stage pyrolysis process can be carried out for a time period of at least 10 min. While the second time period is about 10~40% of the first time period.

The present invention novel method for forming silicon oxide layers in a wet oxidation furnace by utilizing a dual-stage pyrolysis process has therefore been amply described in the above descriptions and in the appended drawing of FIG. 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming silicon oxide by wet oxidation comprising the steps of:
   providing an oxidation chamber equipped with a torch and a conduit providing fluid communication between said chamber and said torch,
   positioning a plurality of silicon wafers in said oxidation chamber,
   flowing a first $H_2/O_2$ mixture having a first $H_2/O_2$ gas mixture ratio into said torch and feeding water vapor generated through said conduit into said oxidation chamber for a first time period, said first time period is between about 30 min. and about 90 min., and
   flowing a second $H_2/O_2$ mixture having a second $H_2/O_2$ gas mixture ratio into said torch and feeding water vapor generated through said conduit into said oxidation chamber for a second time period, said second time period is between about 1.0 min. and about 30 min., said second $H_2/O_2$ gas mixture ratio being smaller than said first $H_2/O_2$ gas mixture ratio by at least $\frac{1}{3}$ of the value of said first $H_2/O_2$ gas mixture ratio.

2. A method for forming silicon oxide by wet oxidation accordingly to claim 1, wherein said second time period being smaller than said first time period.

3. A method for forming silicon oxide by wet oxidation accordingly to claim 1, wherein said second time period being between about 10% and about 40% of said first time period.

4. A method for forming silicon oxide by wet oxidation accordingly to claim 1, wherein said first $H_2/O_2$ gas mixture ratio being larger than 1.2 and said second $H_2/O_2$ gas mixture ratio being smaller than 1.2.

5. A method for forming silicon oxide by wet oxidation accordingly to claim 1, wherein said first $H_2/O_2$ gas mixture ratio being larger than 1.6 and said second $H_2/O_2$ gas mixture ratio being smaller than 1.1.

6. A method for forming silicon oxide by wet oxidation accordingly to claim 1 further comprising a nitrogen purging process and an oxygen annealing process.

7. A method for forming silicon oxide by wet oxidation accordingly to claim 1 further comprising a nitrogen purging process for stopping said flow of $H_2/O_2$.

8. A method for growing oxide on silicon wafers by wet oxidation comprising the steps of:
   providing a wet oxidation chamber equipped with a torch and a conduit providing fluid communication between said chamber and said torch,
   flowing a first $H_2/O_2$ mixture having a $H_2/O_2$ gas mixture ratio larger than 1.5 into said torch and feed water vapor generated through said conduit into said wet oxidation chamber for a first time period, and
   flowing a second $H_2/O_2$ mixture having a $H_2/O_2$ gas mixture ratio smaller than 1.2 into said torch and feed water vapor generated through said conduit into said wet oxidation chamber for a second time period.

9. A method for growing silicon oxide on silicon wafers by wet oxidation according to claim 8 further comprising of the step of positioning each of said plurality of silicon wafers horizontally in a vertical stack.

10. A method for growing oxide on silicon wafers by wet oxidation according to claim 8 further comprising of the step of flowing $H_2$ and $O_2$ individually into said torch for mixing in said torch and reacting pyrolytically to produce $H_2O$ vapor.

11. A method for growing silicon oxide on silicon wafers by wet oxidation according to claim 8, wherein said first time period being at least, two times of said second time period.

12. A method for growing silicon oxide on silicon wafers by wet oxidation according to claim 8, wherein said first time period being at least three times of said second time period.

13. A method for growing silicon oxide on silicon wafers by wet oxidation according to claim 8, wherein said first time period being more than 40 min. and said second time period being less than 20 min.

14. A method for growing silicon oxide on silicon wafers by wet oxidation according to claim 8, wherein said second $H_2/O_2$ gas mixture ratio being smaller than said first $H_2/O_2$ gas mixture ratio by at least $\frac{1}{3}$ of the value of said first $H_2/O_2$ gas mixture ratio.

15. A method for growing silicon oxide on silicon wafers by wet oxidation according to claim 8 further comprising the step of depositing silicon oxide layers on said plurality of silicon wafers to a thickness of at least 1000 Å.

16. A method for growing silicon oxide on silicon wafers by wet oxidation according to claim 8 further comprising the step of depositing silicon oxide layers on said plurality of silicon wafers to a thickness of at least 2000 Å.

17. A dual-stage wet oxidation process for forming silicon oxide comprising the steps of:
   providing an oxidation chamber equipped with a torch and a conduit providing fluid communication between said chamber and said torch,
   positioning a plurality of silicon wafers horizontally in a vertical stack in said chamber,
   flowing a $H_2/O_2$ mixture having a $H_2/O_2$ gas mixture ratio larger than 1.5 into said torch and feeding water vapor generated through said oxidation chamber for more than 40 min. in a first stage for forming a first thickness of silicon oxide, and
   flowing a $H_2/O_2$ mixture having a $H_2/O_2$ gas mixture ratio smaller than 1.2 into said torch and feeding water vapor generated through said conduit into said oxidation chamber for less than 20 min. in a second stage for forming a second thickness of silicon oxide.

18. A dual stage wet oxidation process for forming silicon oxide according to claim 17 further comprising the step of forming said first and second thicknesses of silicon oxide on said plurality of silicon wafers to a total thickness of at least 2000 Å.

19. A dual stage wet oxidation process for forming silicon oxide according to claim 17 further comprising a nitrogen purging step and an oxygen annealing step after said first and second stage of forming silicon oxide.

* * * * *